(12) United States Patent
Sugawara et al.

(10) Patent No.: US 7,522,262 B2
(45) Date of Patent: Apr. 21, 2009

(54) METHOD FOR DETERMINING POSITION OF REFERENCE POINT

(75) Inventors: Hiroyuki Sugawara, Hitachinaka (JP); Takeshi Goto, Ebina (JP); Kounosuke Kitamura, Ebina (JP); Hiroshi Aoyama, Ebina (JP)

(73) Assignee: Hitachi Via Mechanics Ltd., Ebina-shi (JP)

( * ) Notice: Subject to any disclaimer, the term of this patent is extended or adjusted under 35 U.S.C. 154(b) by 154 days.

(21) Appl. No.: 11/141,393

(22) Filed: Jun. 1, 2005

(65) Prior Publication Data

US 2005/0270518 A1     Dec. 8, 2005

(30) Foreign Application Priority Data

Jun. 3, 2004     (JP)     ............................. 2004-165918

(51) Int. Cl.
*G03B 27/42* (2006.01)
*G01B 11/00* (2006.01)

(52) U.S. Cl. .......................... 355/53; 356/399; 356/401

(58) Field of Classification Search ............... 355/53, 355/72; 356/399, 400, 401; 702/179; 430/22, 430/30; 257/797
See application file for complete search history.

(56) References Cited

U.S. PATENT DOCUMENTS

| 2003/0158701 A1* | 8/2003 | Yasuda et al. ............... 702/179 |
| 2004/0207097 A1* | 10/2004 | Carpi et al. ................. 257/797 |

* cited by examiner

*Primary Examiner*—Peter B Kim
(74) *Attorney, Agent, or Firm*—Crowell & Moring LLP

(57) ABSTRACT

A method for determining a position of a reference point in which there is no influence of aberration of a camera lens or the like, but an error caused by a failure in shape of an alignment mark can be reduced. An alignment mark consisting of a plurality of pattern portions (and background portions) centering at a design reference point is provided in advance. Positions of centers of border lines of the patterns are calculated. Obtained coordinate values of the centers are averaged in each axial direction. The averaged coordinate values are regarded as coordinate values of a machining reference point. Thus, even when a defect occurs in any pattern portion, an error caused by the defect is reduced so that the accuracy in machining can be improved.

3 Claims, 3 Drawing Sheets

METHOD FOR DETERMINING POSITION OF REFERENCE POINT

FIELD OF THE INVENTION

The present invention relates to a method for determining a position of a reference point to be used for machining a printed circuit board or the like.

BACKGROUND OF THE INVENTION

As electronic equipment is reduced in size and increased in packaging density, multilayer wiring boards having a plurality of boards laminated to one another have prevailed as printed circuit boards. In any multilayer wiring board, it is necessary to electrically connect conductive layers of upper and lower laminated boards with each other. For this purpose, via holes reaching a conductive layer of a lower layer are formed in an insulating layer of the multilayer wiring board, and conductive plating is performed on the inside of each via hole so as to electrically connect the conductive layers of the upper and lower laminated boards.

As via holes are made finer, a high power $CO_2$ laser or a UV laser using harmonics of YAG is used for forming the via holes. In addition, high-speed machining can be attained by scanning with a laser beam using a beam scan optical system comprising a combination of steerable mirrors and fθ lenses. However, as the holes are made smaller in diameter or smaller in pitch, more severe accuracy with respect to a machining position has been requested. Alignment marks provided in the four corners of a printed circuit board are often used as references for positioning the printed circuit board. Specifically, the printed circuit board is mounted on an XY table. An image of each alignment mark is picked up from above by a camera or the like. The center of the alignment mark is obtained by image processing. Then, machining is performed while a displacement of each point on the board is calculated and corrected. However, the alignment mark may be altered from their predetermined shape due to a failure in etching, a dust, etc.

In order to reduce a position error caused by the defective shapes of alignment marks, there has been proposed a technique in which one alignment mark consists of a plurality of small marks (JP-A-2001-291095 (Page 3, FIG. 1)).

There has been another technique in which hole marks are disposed concentrically (JP-A-S61-125712 (FIG. 8)).

However, in JP-A-2001-291095, the center positions of the small marks differ from one to another. Accordingly, due to influence of aberration of a camera lens or the like, it is difficult to make the position error of a reference point, for example, smaller than 5 μm by use of a combination of an inexpensive camera and an inexpensive camera lens.

On the other hand, in JP-A-S61-125712, there is little influence of aberration of a camera lens or the like. However, the center position of the hole marks is obtained from a part of the hole marks disposed concentrically. Accordingly, due to influence of a failure in etching, a dust, etc., it is difficult to make the position error of a reference position, for example, smaller than 5 μm.

SUMMARY OF THE INVENTION

In order to solve the foregoing problems, an object of the present invention is to provide a method for determining a position of a reference point, in which there is no influence of aberration of a camera lens or the like, but an error caused by a failure in shape of an alignment mark can be reduced.

In order to solve the foregoing problems, the present invention provides a method for determining a position of a reference point, including the steps of: providing an alignment mark at a reference point in design, where the alignment mark consists of a plurality of patterns centering at the reference point; obtaining coordinate values (X-coordinate values and Y-coordinate values) of centers of figures surrounded by border lines of the patterns; averaging the obtained plural coordinate values of the centers in each of X- and Y-directions; and setting average values obtained respectively in the directions, as coordinate values of a reference point in machining.

Since the position of each reference point can be determined accurately, the accuracy in machining can be improved.

DESCRIPTION OF THE PREFERRED EMBODIMENT

Figure 1:
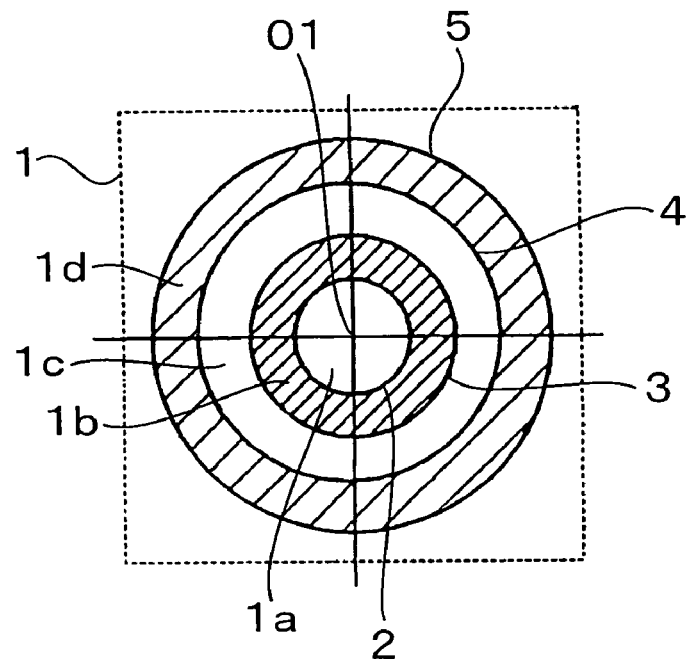
FIG. 1 is a plan view of an alignment mark according to the present invention.
Figures 2A, 2B, 2C, 2D:
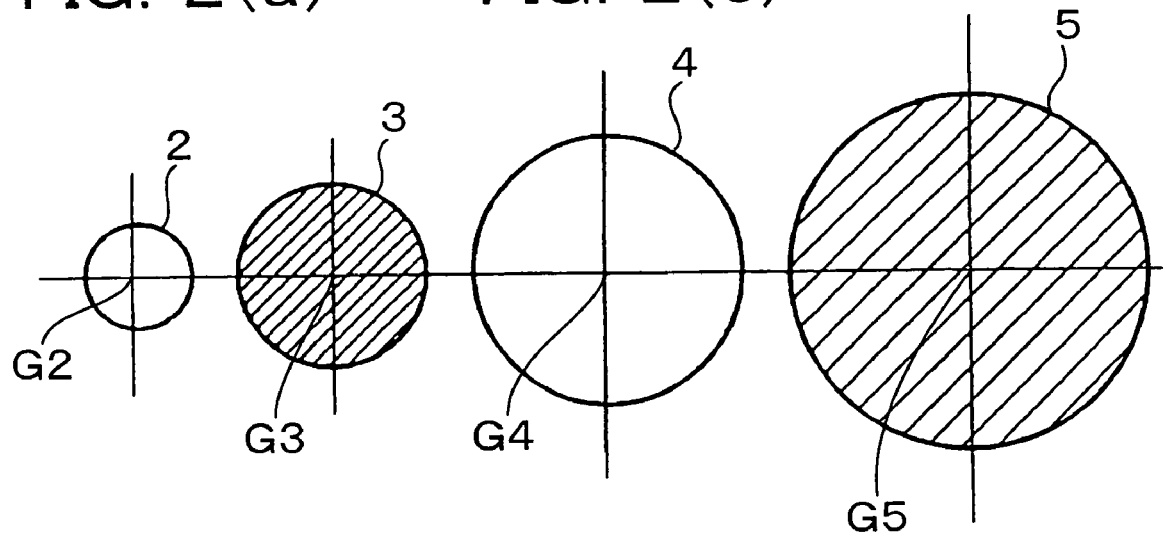
FIGS. 2A-2D are views for explaining a method for determining a position of a machining reference mark according to the present invention.

FIG. 1 is a plan view of an alignment mark according to the present invention. FIGS. 2A-2D are views for explaining a method for determining the position of a machining reference point according to the present invention.

In an alignment mark 1 enclosed by the broken line in FIG. 1, background portions 1a and 1c (white portions) and pattern portions 1b and 1d (shaded portions) of a circle pattern are formed alternately and concentrically around a designed reference point 01. The alignment mark 1 is positioned so that the reference point 01 of the alignment mark 1 is nearly aligned with the optical axis of a camera lens. After that, an image of the alignment mark 1 is picked up. When the reference point 01 of the alignment mark 1 is aligned with the optical axis of the camera lens, the influence of the aberration of the camera lens becomes the least. Accordingly, the error of a picture detection system can be reduced. Incidentally, when there is a large displacement between the detected position of the designed reference point 01 and the optical axis of the camera lens, the displacement is corrected, and the alignment mark 1 is positioned again. Then, the alignment mark 1 is re-detected.

Image processing such as binarization is applied to the detected image of the alignment mark 1 so that border lines 2, 3, 4 and 5 of the pattern portions 1b and 1d are determined, as shown in FIGS. 2A-2D.

Next, the coordinate values (X-coordinate values and Y-coordinate values) of centers G2, G3, G4 and G5 of figures surrounded by the determined border lines 2 to 5 are obtained respectively. The coordinate values of the centers G2, G3, G4 and G5 are averaged in each of the X and Y directions. Average values obtained thus in the respective directions are set as coordinate values of a machining reference point G1.

Incidentally, there are some methods for obtaining the coordinates of the center of a figure by image processing, such as a method in which the area centroid of a figure surrounded by a border line is obtained, a method in which the optimally fit position of a designated shape is obtained from contour information and the center of a figure in question is obtained from the obtained optimally fit position, and so on. Here, the area centroid of a figure is regarded as the center of the figure.

If there is no deformation in the pattern portions and the image processing is performed ideally, all the centers G2 to G5 will agree with the designed reference point 01. Accordingly, the machining reference point G1 will agree with the designed reference point 01.

Next, description will be made on the case where a failure in shape occurs in the alignment mark 1.

Figure 3:
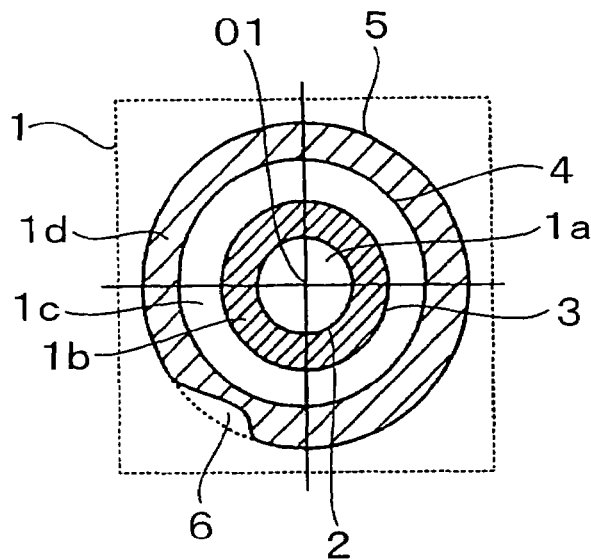
FIG. 3 is a plan view of an alignment mark where a failure in shape occurs.

FIG. 3 is a plan view of the alignment mark 1 where a failure in shape occurs. FIGS. 4A-4D are views for explaining the method for determining the position of the machining reference point according to the present invention. The parts which are the same as or functionally the same as those in FIG. 1 are denoted by the same reference numerals correspondingly, and description thereof will be omitted.

Figures 4A, 4B, 4C, 4D:
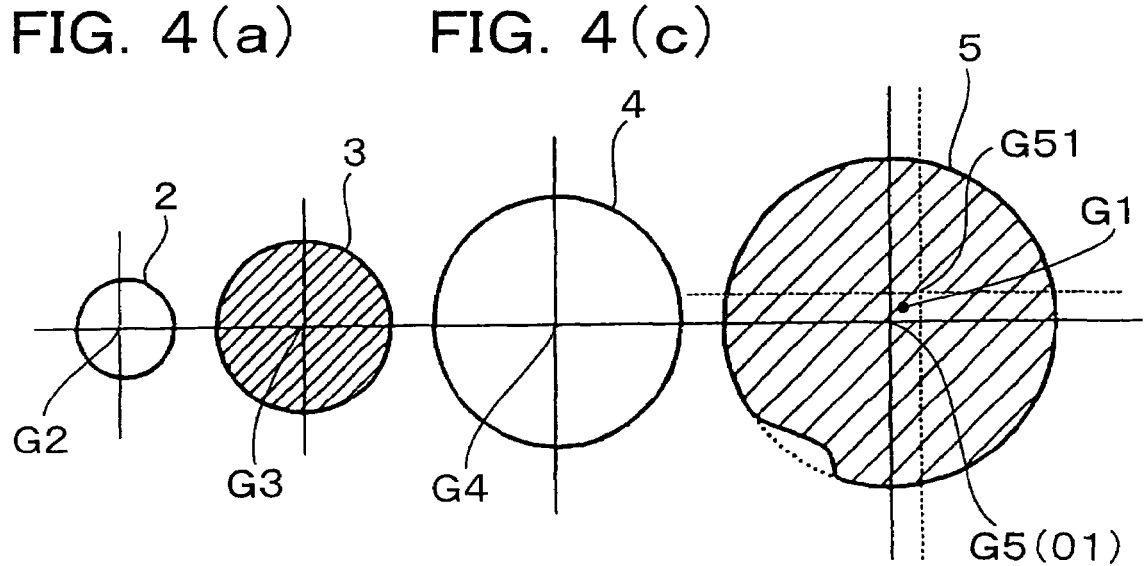
FIGS. 4A-4D are views for explaining the method for determining a position of a machining reference mark according to the present invention.
Figure 5A:
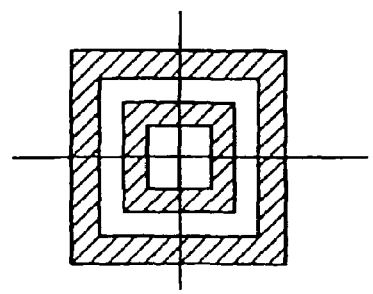
FIGS. 5A-5D are views showing examples of shapes of patterns forming alignment marks.
Figure 5C:
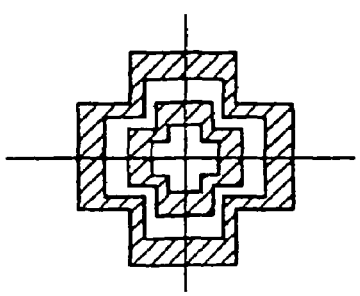
Figure 5B:
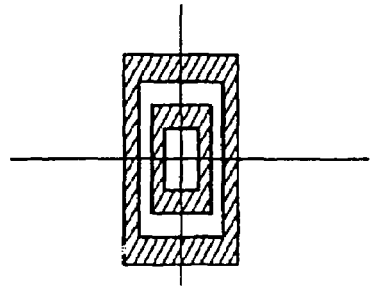
Figure 5D:
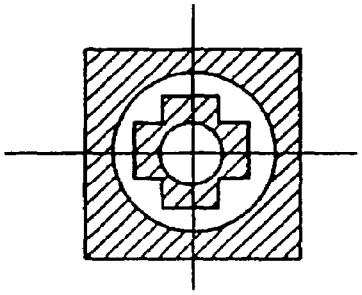

When there occurs a defective spot 6 in the alignment mark 1 as shown in FIG. 3, the center of the figure surrounded by the border line 5 is displaced from G5 to G51 as shown in FIG. 4D. However, there is no influence of the defective spot 6 on the border lines 2, 3 and 4. Accordingly, in the illustrated case, the machining reference point Gi centering at coordinate values obtained by averaging the coordinate values of the centers G2, G3, G4 and G51 in the respective directions is located in a position ¼ distant from the center 01 to the center G51 on a line segment (not shown) between 01 and G51.

In such a manner, the error is averaged as compared with the case where the alignment mark 1 is constituted by one pattern (mark). Thus, the detection error can be reduced.

Incidentally, when the respective coordinate values of the centers G2, G3 and G4 other than the center G51 having a large displacement are averaged, the detection error can be more reduced. As for a method for determining which center to exclude when the average values are calculated, the coordinate values of all the centers may be once calculated, and a center the most farthest from the calculated center may be excluded, or centers whose error amount from an average value of the distribution of coordinate values exceeds a predetermined allowable value may be excluded. Alternatively, a rule may be defined in advance, such that centers out of a range of (average value of distribution of center coordinate values)±(standard deviation) are excluded.

FIGS. 5A-5D are views showing examples of shapes of patterns constituting alignment marks.

Any shapes of patterns constituting an alignment mark may be used if the centers of figures surrounded by the border lines of the patterns agree with one another. Such as square marks shown in FIG. 5A, rectangular marks shown in FIG. 5B, combined crucial marks shown in FIG. 5C, etc., or combined patterns having different shapes shown in FIG. 5D.

Next, the operation of a laser machining apparatus according to the present invention will be described.

Figure 6:
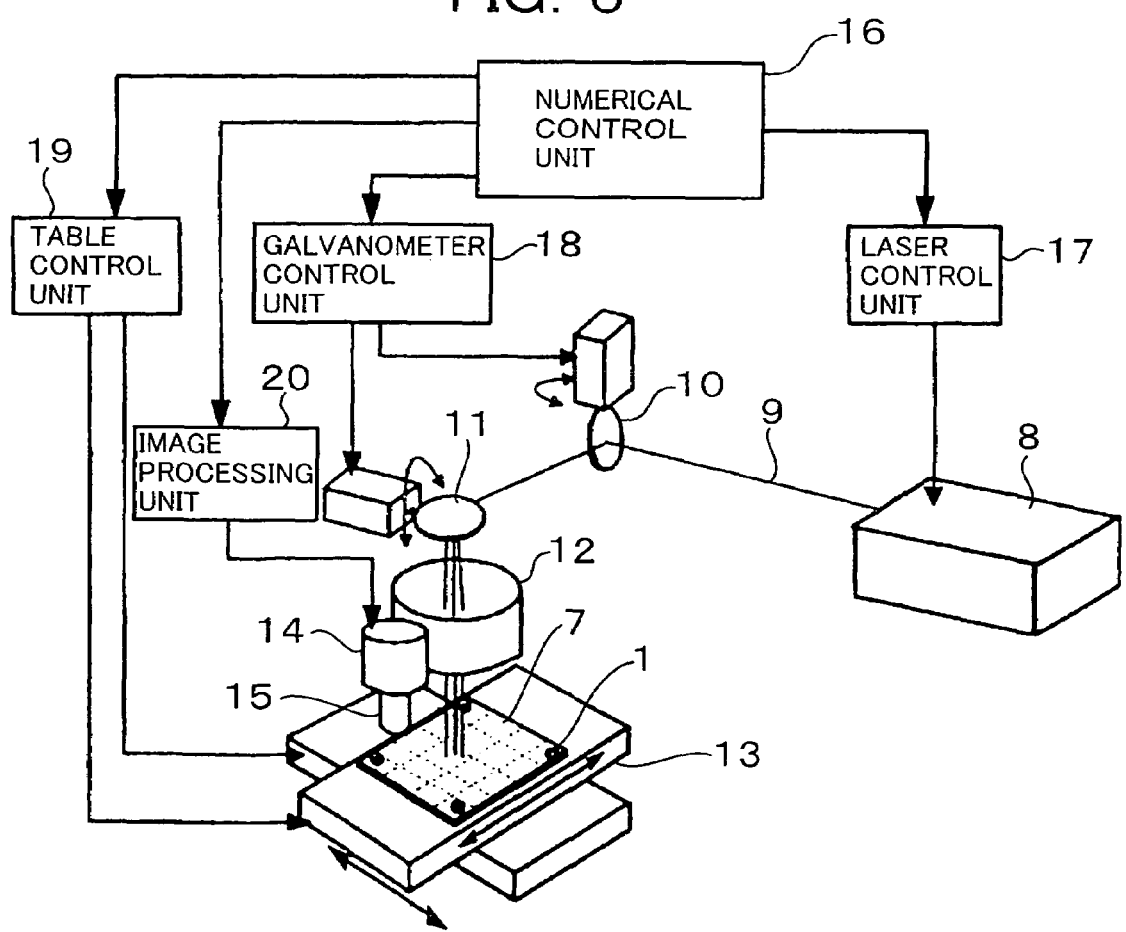
FIG. 6 is a schematic configuration view of a laser machining apparatus according to the present invention.

FIG. 6 is a schematic configuration view of a laser machining apparatus according to the present invention.

A numerical control unit 16 controls a laser control unit 17, a galvanometer control unit 18, a table control unit 19 and an image processing unit 20.

The laser control unit 17 controls a laser oscillator 8 to output a laser beam 9. The galvanometer control unit 18 controls the rotation angles of steerable mirrors 10 and 11. The table control unit 19 positions a printed circuit board 7 with an XY table 13. The image processing unit 20 processes an image of each pattern constituting the alignment mark 1 picked up by a camera 14, so as to obtain coordinates of the center of figure surrounded by the border line of the pattern. After that, the image processing unit 20 averages coordinate values of a plurality of centers obtained thus, in the respective axial directions, so as to obtain coordinates of a machining reference point.

The alignment mark 1 serving as reference of a machining position is drawn in each of the four corners of the printed circuit board 7. The printed circuit board 7 is mounted on the XY table 13.

The steerable mirrors 10 and 11 and an fθ lens 12 are disposed on the optical path of the laser oscillator 8.

The fθ lens 12 is a lens designed so that the converging position of a light incident on the fθ lens 12 at an incident angle θ is located in a position f×θ (provided f designates the focal length of the fθ lens 12) distant from the optical axis on the board 7. The fθ lens 12 also has a function of converging the laser beam 9 onto the printed circuit board.

The camera 14 is disposed in a position opposed to the XY table 13, so that the optical axis of a camera lens 15 is vertical.

Next, description will be made on the operation.

Prior to machining, the XY table 13 is moved so that images of the alignment marks 1 are picked up by the camera 14, and positions of respective reference points (four in the illustrated case) are determined in the aforementioned procedure. Then, based on the positions of the respective reference points determined thus, for example, the position of the printed circuit board 7 on the XY table 13, inclinations of the printed circuit board 7 with respect to the X and Y axes, etc. are obtained.

Then, laser machining is performed using a predetermined machining program memorized in the numerical control unit 16.

The laser beam 9 is emitted from the laser oscillator 8 in response to an instruction of the laser control unit 17 in accordance with machining conditions (peak output, repetition frequency, number of pulse shots, etc.) predetermined in accordance with the kind of hole to be machined. The laser beam 9 is incident on the steerable mirrors 10 and 11 so that the incident angle of the laser beam 9 on the fθ lens 12 is controlled.

When machining of a region (usually about 50 mm square) determined by the dimensions of the fθ lens 12, is finished, the printed circuit board 7 is moved to a region to be machined next. When such an operation is repeated, the whole surface of the printed circuit board 7 is machined with the laser beam 9.

As described above, according to the present invention, a detection error caused by a failure in alignment marks or the like and an error caused by aberration of a camera lens can be reduced. Thus, machining can be performed with high precision and with high reliability.

What is claimed is:

1. A method for determining a position of a reference point, comprising the steps of:
   providing an alignment mark at a reference point on a board in a design, where said alignment mark consists of a plurality of pattern portions concentrically surrounding and centering at said reference point;
   obtaining coordinate values of centers of figures surrounded by border lines of said pattern portions in said alignment mark;
   determining whether or not to exclude one of said centers of said pattern portions with obtained data on the board alone based on a predetermined rule;

averaging said obtained plural coordinate values of remaining ones of said centers in each of X- and Y-directions; and setting average values, obtained respectively in said directions, as coordinate values of said reference point in machining.

2. A method for determining a position of a reference point according to claim 1, wherein said predetermined rule is to exclude a center at a longest distance from the coordinate obtained by averaging all of said centers.

3. A method for determining a position of a reference point according to claim 1, wherein said predetermined rule is to exclude a center having an error amount from an average value of the distribution of coordinate values that exceeds a predetermined allowable value.

* * * * *